United States Patent
Xi et al.

(10) Patent No.: US 10,649,250 B2
(45) Date of Patent: May 12, 2020

(54) PHOTOSENSITIVE DETECTION MODULE, LIGHT SOURCE MODULE AND ELECTROPHORESIS DISPLAY APPARATUS

(71) Applicant: Shanghai AVIC Optoelectronics Co., Ltd., Shanghai (CN)

(72) Inventors: Kerui Xi, Shanghai (CN); Tingting Cui, Shanghai (CN); Xiaohe Li, Shanghai (CN)

(73) Assignee: SHANGHAI AVIC OPTOELECTRONICS CO., LTD., Shanghai (CN)

( * ) Notice: Subject to any disclaimer, the term of this patent is extended or adjusted under 35 U.S.C. 154(b) by 52 days.

(21) Appl. No.: 15/913,261

(22) Filed: Mar. 6, 2018

(65) Prior Publication Data
US 2018/0203276 A1 Jul. 19, 2018

(30) Foreign Application Priority Data
Jan. 3, 2018 (CN) .......................... 2018 1 0004253

(51) Int. Cl.
*G02F 1/167* (2019.01)
*G02F 1/133* (2006.01)
(Continued)

(52) U.S. Cl.
CPC .......... *G02F 1/13318* (2013.01); *G02F 1/167* (2013.01); *H01L 27/1443* (2013.01);
(Continued)

(58) Field of Classification Search
CPC ............. G02F 1/167; G02F 2001/1678; G02F 1/1681; G02F 1/1676; G09G 3/344
(Continued)

(56) References Cited

U.S. PATENT DOCUMENTS 4,916,323 A * 4/1990 Hayashi ............ H01L 31/02021
136/293
2008/0284396 A1* 11/2008 Hata ...................... H02M 3/156
323/282
(Continued)

FOREIGN PATENT DOCUMENTS

CN 1382952 A 12/2002
CN 1838224 A 9/2006
(Continued)

*Primary Examiner* — Mohammed A Hasan
(74) *Attorney, Agent, or Firm* — Anova Law Group PLLC

(57) ABSTRACT

A photosensitive detection module is provided, comprising a photosensitive circuit, wherein the photosensitive circuit comprises a first resistive element, a second resistive element, a third resistive element, a fourth resistive element to form a resistor bridge, a first input terminal connected to a node between the first resistive element and the third resistive element, a second input terminal connected to a node between the second resistive element and the fourth resistive element, a first output terminal connected to a node between the first resistive element and the second resistive element, and a second output terminal connected to a node between the third resistive element and the fourth resistive element. All four resistive elements have an identical initial resistance value. The first resistive element and the fourth resistive element are photosensitive resistive elements.

8 Claims, 8 Drawing Sheets

(51) Int. Cl.
*H01L 27/144* (2006.01)
*H01L 31/113* (2006.01)
*H01L 29/768* (2006.01)
*H01L 31/02* (2006.01)
*H01L 31/09* (2006.01)
*H01L 27/12* (2006.01)
*H01L 31/0368* (2006.01)
*H01L 29/417* (2006.01)

(52) U.S. Cl.
CPC ...... *H01L 29/768* (2013.01); *H01L 31/02019* (2013.01); *H01L 31/1136* (2013.01); *G02F 2001/13312* (2013.01); *H01L 27/1214* (2013.01); *H01L 29/41733* (2013.01); *H01L 31/03682* (2013.01); *H01L 31/09* (2013.01)

(58) Field of Classification Search
USPC .......................................................... 359/296
See application file for complete search history.

(56) References Cited

U.S. PATENT DOCUMENTS

| | | | | |
|---|---|---|---|---|
| 2009/0134333 A1* | 5/2009 | Ishibashi | ................... | G01J 1/44 250/352 |
| 2011/0169677 A1* | 7/2011 | Dosho | ................ | H03H 11/1252 341/143 |
| 2012/0133422 A1* | 5/2012 | Pereira da Silva, Jr. | ................... | G01K 7/01 327/512 |

FOREIGN PATENT DOCUMENTS

| CN | 101064092 A | 10/2007 |
|---|---|---|
| CN | 201887679 U | 6/2011 |
| CN | 104316170 A | 1/2015 |
| CN | 105068562 A | 11/2015 |

* cited by examiner

PHOTOSENSITIVE DETECTION MODULE, LIGHT SOURCE MODULE AND ELECTROPHORESIS DISPLAY APPARATUS

CROSS-REFERENCES TO RELATED APPLICATIONS

This application claims the priority of Chinese Patent Application No. 201810004253.4, filed on Jan. 3, 2018, the entire contents of which are incorporated herein by reference.

FIELD OF THE DISCLOSURE

The present disclosure generally relates to the field of display technology and, more particularly, relates to a photosensitive detection module, a light source module including the photosensitive detection module, and an electrophoresis display apparatus.

BACKGROUND

In recent years, displays are gradually becoming lighter and thinner, and electrophoresis display apparatus is a kind of displays which satisfies the demands. Electrophoresis display apparatuses are featured with various advantages such as low power consumption, high reflectivity and high contrast ratio and, thus, are widely used in electronic readers (e.g., e-books, electronic newspapers) or other electronic components (e.g., price tags).

In existing technology, electrophoresis display apparatus display images by irradiating incident light on a display dielectric layer, such that a backlight is removed and the power consumption is reduced accordingly. However, because the electrophoresis display apparatus relies entirely on the reflection mode to display images, the electrophoresis display apparatus may not work in absence of external light. That is, the display apparatus may only be operated under bright ambient light such as in the day time, but may not be operated under dark or without ambient light such as at during the night.

To expand the applications of the electrophoresis display apparatus, a front light module is configured above the front panel of the electrophoresis display apparatus. Thus, when the electrophoresis display apparatus is placed in places with insufficient ambient light, the front light module irradiates incident light on the display dielectric layer, and viewers are able to view images displayed on electrophoresis display apparatus.

The disclosed photosensitive detection module, light source module, and electrophoresis display apparatus are directed to solve one or more problems set forth above and other problems.

BRIEF SUMMARY OF THE DISCLOSURE

The present disclosure provides a photosensitive detection module, a light source module including the photosensitive detection module, an electrophoresis display apparatus.

One aspect of the present disclosure provides a photosensitive detection module, comprising a photosensitive circuit, which includes a first resistive element, a second resistive element, a third resistive element, and a fourth resistive element to form a resistor bridge, and a first input terminal connected to a node between the first resistive element and the third resistive element, a second input terminal connected to a node between the second resistive element and the fourth resistive element, a first output terminal connected to a node between the first resistive element and the second resistive element, and a second output terminal connected to a node between the third resistive element and the fourth resistive element. The first resistive element, the second resistive element, the third resistive element, and the fourth resistive element have identical initial resistance values. The first resistive element and the fourth resistive element are photosensitive resistive elements, and the material forming the first resistive element and the material forming the fourth resistive element have identical photosensitivity. The material forming the second resistive element and the material forming the third resistive element have identical temperature sensitivity coefficients.

Another aspect of the present disclosure provides a light source module, comprising a light source unit, a light source driving unit, and a disclosed photosensitive detection module. In response to brightness change of ambient environment, the photosensitive detection module generates an output voltage, and sends the output voltage to the light source driving unit. Based on the output voltage received from the photosensitive detection module, the light source driving unit adjusts brightness of the light source unit.

Another aspect of the present disclosure provides an electrophoresis display apparatus, comprising an electrophoresis display panel including an array substrate, a protective layer, and an electrophoresis film layer disposed between the array substrate and the protective layer; and a disclosed light source module for providing lighting for the electrophoresis display panel.

Other aspects of the present disclosure can be understood by those skilled in the art in light of the description, the claims, and the drawings of the present disclosure.

BRIEF DESCRIPTION OF THE DRAWINGS

To more clearly illustrate the technical solution in the present disclosure, the accompanying drawings used in the description of the disclosed embodiments are briefly described hereinafter. Obviously, the drawings described below are merely some embodiments of the present disclosure. Other drawings may be derived from such drawings by a person with ordinary skill in the art without creative efforts.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Various exemplary embodiments of the present disclosure will now be described in detail with reference to the accompanying drawings. It should be noted that the relative arrangement of the components and steps, numerical expressions and numerical values set forth in these embodiments do not limit the scope of the present disclosure unless it specifically stated otherwise.

The following description of at least one exemplary embodiment is merely illustrative and by no means to be construed as any limitation on the disclosure and its applications.

Techniques, methods, and apparatus known to one of ordinary skill in the art may not be discussed in detail. But, wherever appropriate, the techniques, methods, and apparatus should be considered as part of the description.

In all examples shown and discussed herein, any specific value should be interpreted as merely illustrative and not a limitation. Thus, other examples of the embodiments may have different values.

It should be noted that similar reference numbers and letters designate similar items in the following figures. Thus, once an item is defined in one figure, the same item need not be described in subsequent figures.

The present disclosure provides an improved photosensitive detection module that is insensitive to operating temperature change.

Figure 1:
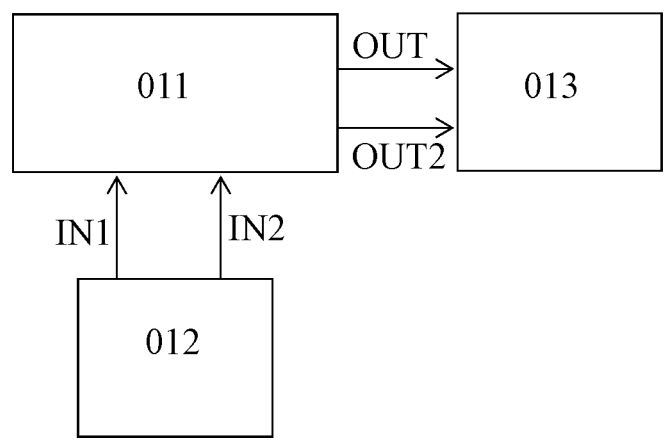
FIG. 1 illustrates a schematic diagram of an exemplary photosensitive detection module according to disclosed embodiments.

FIG. 1 illustrates a schematic diagram of an exemplary photosensitive detection module according to the disclosed embodiments. As shown in FIG. 1, the photosensitive detection module 01 may include a photosensitive circuit 011, a bias voltage supplying circuit 012, and a voltage detection circuit 013. The photosensitive circuit 011 may include a first input terminal IN1, a second input terminal IN2, a first output terminal OUT1, and a second output terminal OUT2.

The bias voltage supplying circuit 012 may be connected to the first input terminal IN1 and the second input terminal IN2 of the photosensitive circuit 011, to supply a bias voltage to the photosensitive circuit 011. The voltage detection circuit 013 may be connected to the first output terminal OUT1 and the second output terminal OUT2 of the photosensitive circuit 011, to detect an output voltage of the photosensitive circuit 011.

Figure 2:
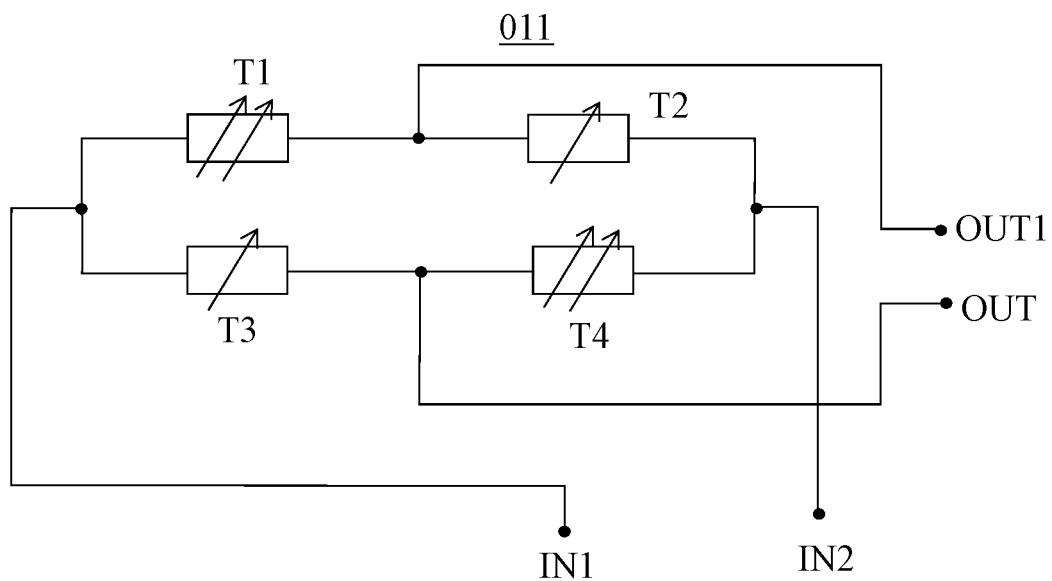
FIG. 2 illustrates a schematic diagram of an exemplary photosensitive circuit according to disclosed embodiments.

An exemplary structure of the photosensitive circuit 011 is shown in FIG. 2. FIG. 2 illustrates a schematic diagram of an exemplary photosensitive circuit according to the disclosed embodiments.

As shown in FIG. 2, the photosensitive circuit 011 may include a first resistive element T1, a second resistive element T2, a third resistive element T3, and a fourth resistive element T4 to form a resistor bridge. The first input terminal IN1 may be connected to a node between the first resistive element T1 and the third resistive element T3. The second input terminal IN2 may be connected to a node between the second resistive element T2 and the fourth resistive element T4. The first output terminal OUT1 may be connected to a node between the first resistive element T1 and the second resistive element T2. The second output terminal OUT2 may be connected to a node between the third resistive element T3 and the fourth resistive element T4.

In one embodiment, the first resistive element T1 and the fourth resistive element T4 each may be a photosensitive resistive element, and the photosensitivity of the material forming the first resistive element T1 and the fourth resistive element T4 may be identical. The photosensitivity may refer to a relative change between the resistance of the photosensitive resistor without being exposed to light irradiation and the resistance of the photosensitive resistor after being exposed to light irradiation. For example, the photosensitive resistive element may be a special resistive element made of a semiconductor material. When the material forming the photosensitive resistive element is irradiated by light having a certain wavelength, the resistance may decrease rapidly. Carriers generated by light irradiation in the material may diffuse, in which electrons may be attracted to a positive electrode of the power supply, and holes may be attracted to a negative electrode of the power supply, such that the resistance of the photosensitive resistive element may decrease rapidly.

Further, the material forming the second resistive element T2 and the material forming the fourth resistive element T4 may have an identical temperature sensitivity coefficient. The material forming the first resistive element T1 and the material forming the third resistive element T3 may have an identical temperature sensitivity coefficient. The temperature sensitivity coefficient may indicate a relative change in resistance when the temperature of the resistive element changes by 1° C.

In particular, the first resistive element T1, the second resistive element T2, the third resistive element T3, and the fourth resistive element T4 in the photosensitive circuit 011 may have initial resistance values as R1, R2, R3, and R4, respectively, and R1=R2=R3=R4. In the disclosed embodiments, the initial resistance value may refer to a resistance value measured at an ambient temperature of 25° C. and before the first resistive element T1, the second resistive element T2, the third resistive element T3, and the fourth resistive element T4 are mounted to the circuit without being exposed to light irradiation.

The resistance value may depend on the material, length, and cross section area of the first resistive element T1, the second resistive element T2, the third resistive element T3, and the fourth resistive element T4. After the first resistive element T1, the second resistive element T2, the third resistive element T3, and the fourth resistive element T4 are formed, the first resistive element T1, the second resistive element T2, the third resistive element T3, and the fourth resistive element T4 may have a fixed initial resistance value, respectively. After the first resistive element T1, the second resistive element T2, the third resistive element T3, and the fourth resistive element value T4 are mounted to the circuit, the respective resistance value may change when being subjected to the operating temperature change or being exposed to light irradiation. The resistance value may increase or decrease relative to the initial resistance value. However, the initial resistance value is fixed.

RM is defined as a sum of R1 and R2, and the sum of R1 and R2 is configured to be equal to a sum of R3 and R4, i.e., RM=R1+R2=R3+R4.

The bias voltage supplying circuit 012 may supply a bias voltage ($V_H$-$V_L$) between a terminal A and a terminal B. The first resistive element T1 and the second resistive element T2 connected in a series branch may divide the voltage. Similarly, the second resistive element T3 and the fourth resistive element T4 connected in another series branch may divide the voltage. Thus, the initial output voltage of the photosensitive circuit 011 may be:

$$V_{(OUT1-OUT2)} = V_{OUT1} - V_{OUT2}$$
$$= (V_H - V_L) * R2/(R1+R2) - (V_H - V_L) * R4/(R3+R4)$$
$$= (V_H - V_L) * (R2 - R4)/RM$$
$$= 0$$

When the first resistive element T1, the second resistive element T2, the third resistive element T3, and the fourth resistive element T4 mounted to the circuit are in an operating state, the temperature may rise without being exposed to light irradiation. The material forming the second resistive element T2 and the material forming the fourth resistive element T4 may have the identical temperature sensitivity coefficients, and the material forming the first resistive element T1 and the material forming the third resistive element T3 may have the identical temperature sensitivity coefficients. Thus, although the resistance values change with the temperature change when the resistive elements in the circuit are in the operating state, the relative change of the resistance value of the second resistive element T2 may be the same as the relative change of the resistance value of the fourth resistive element T4, assuming the relative change is $\Delta R1$. Similarly, the relative change of the resistance value of the first resistive element T1 may be the same as the relative change of the resistance value of the third resistive element T3, assuming the relative change is $\Delta R2$. Thus, the resistance value of the first resistive element T1 is (R1+$\Delta R2$), the resistance value of the second resistive element T2 is (R2+$\Delta R1$), the resistance value of the third resistive element T3 is (R3+$\Delta R2$), and the resistance value of the fourth resistive element T4 is (R4+$\Delta R1$).

Because RM=R1+R2=R3+R4, the following equations may be obtained:

$$RM + \Delta R1 + \Delta R2 = R1 + R2 + \Delta R1 + \Delta R2 = R3 + R4 + \Delta R1 + \Delta R2, \text{ and}$$

$$V_{(OUT1-OUT2)} = V_{OUT1} - V_{OUT2}$$
$$= (V_H - V_L) * (R2 + \Delta R1)/(R1 + R2 + \Delta R1 + \Delta R2) -$$
$$(V_H - V_L) * (R4 + \Delta R1)/(R3 + R4 + \Delta R1 + \Delta R2)$$
$$= (V_H - V_L) * (R2 - R4)/(RM + \Delta R1 + \Delta R2)$$
$$= 0.$$

Thus, the output voltage of the photosensitive circuit 011 may substantially remain as 0. In other words, the output voltage of the photosensitive circuit 011 may not be affected by the temperature change of the resistive elements in the photosensitive circuit 011.

When the intensity of the light irradiated on the photosensitive circuit 011 changes, because the first resistive element T1 and the fourth resistive element T4 are photosensitive resistive elements, and the material forming the first resistive element T1 and the material forming the fourth resistive element T4 have identical photosensitivity, the resistance values of the first resistive element T1 and the fourth resistive element T4 may change accordingly, and the relative change of the resistance value of the first resistive element T1 may be the same as the relative change of the resistance value of the fourth resistive element T4 may be identical. Meanwhile, the resistance values R2 and R3 of the second resistive element T2 and the third resistive element T3 may substantially remain the same. The relative change in the resistance value for both the first resistive element T1 and the fourth resistive element T4 may be represented by $\Delta R3$. Then, the output voltage of the photosensitive circuit 011 may be calculated as:

$$V_{(OUT1-OUT2)} = V_{OUT1} - V_{OUT2}$$
$$= (V_H - V_L) * R2/(R1 + R2 + \Delta R3) - (V_H - V_L) *$$
$$(R4 + \Delta R3)/(R3 + R4 + \Delta R3)$$
$$= (V_H - V_L) * (R2 - R4 - \Delta R3)/(RM + \Delta R3)$$
$$= (V_H - V_L) * (-\Delta R3)/(RM + \Delta R3)$$
$$\neq 0.$$

In other words, when the intensity of the light irradiated on the photosensitive circuit 011 changes, the output voltage of the photosensitive circuit 011 may no longer be equal to 0. That is, comparing to the initial output voltage, the output voltage of the photosensitive circuit 011 may change. The change in the output voltage of the photosensitive circuit 011 may be detected by a voltage detection circuit.

In the disclosed embodiments, the photosensitive detection module may include the photosensitive circuit. The photosensitive circuit may include the first resistive element T1, the second resistive element T2, the third resistive element T3, and the fourth resistive element T4. The first input terminal IN1 may be connected to the node between the first resistive element T1 and the third resistive element T3. The second input terminal IN2 may be connected to the node between the second resistive element T2 and the fourth resistive element T4. The first output terminal OUT1 may be connected to the node between the first resistive element T1 and the second resistive element T2. The second output terminal OUT2 may be connected to the node between the third resistive element T3 and the fourth resistive element T4. The first resistive element T1, the second resistive element T2, the third resistive element T3, and the fourth resistive element T4 may have an identical initial resistance values. The first resistive element T1 and the fourth resistive element T4 may be photosensitive resistive elements. The material forming the first resistive element T1 and the material forming the fourth resistive element T4 may have an identical photosensitivity.

Further, the material forming the second resistive element T2 and the material forming the fourth resistive element T4 may have an identical temperature sensitivity coefficient. The material forming the first resistive element T1 and the material forming the third resistive element T3 may have an identical temperature sensitivity coefficient.

The output voltage of the photosensitive circuit may not be affected by the temperature change of the resistive elements, and may only correspond to the intensity change of the light irradiated on the photosensitive circuit. Thus, the effect of temperature change on the photosensitive detection module may be eliminated, the intensity of the ambient light may be precisely detected based on the output voltage of the photosensitive circuit, and a stable optoelectronic control circuit may be realized.

In one embodiment, only the first resistive element T1 and the fourth resistive element T4 may be photosensitive resistive elements, while the resistance values of the second resistive element T2 and the third resistive element T3 may be insensitive to the change of the light irradiation. In another embodiment, in addition to the first resistive element T1 and the fourth resistive element T4, other resistive elements may also be photosensitive resistive elements. A corresponding structure is shown in FIG. 3.

Figure 3:
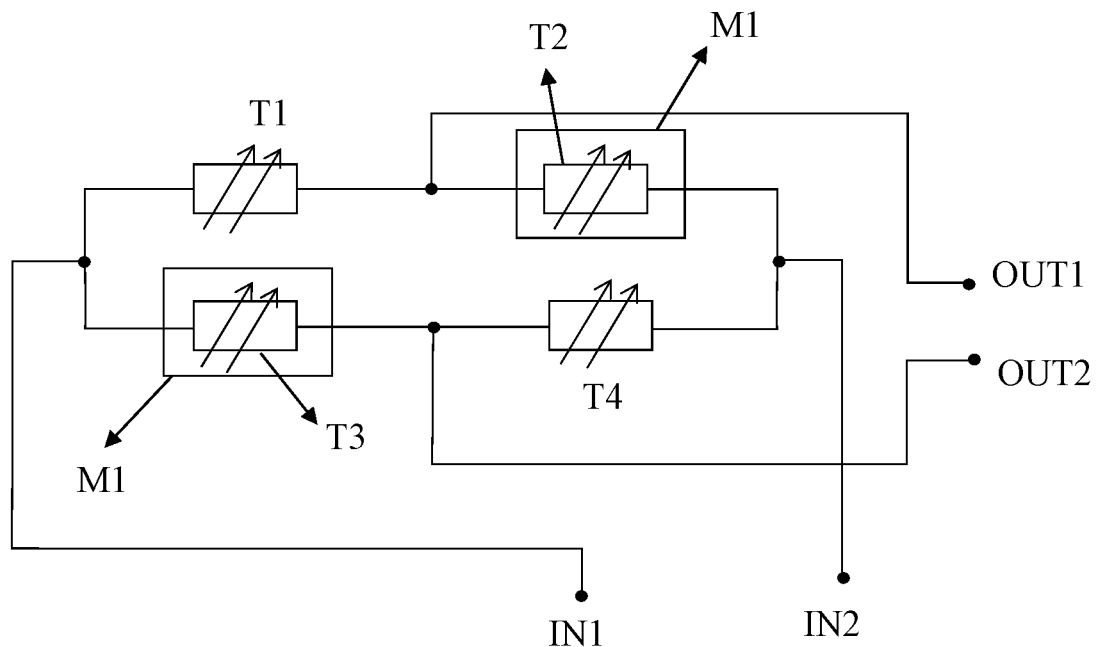
FIG. 3 illustrates a schematic diagram of another exemplary photosensitive circuit according to disclosed embodiments.

FIG. 3 illustrates a schematic diagram of another exemplary photosensitive circuit according to disclosed embodiments. The similarities between FIG. 3 and FIG. 2 are not repeated, while certain difference may be explained.

As shown in FIG. 3, the first resistive elements T1, the second resistive element T2, the third resistive element T3, and the fourth resistive element T4 may be resistive elements made of identical material having identical characteristics. In other words, the first resistive elements T1, the second resistive element T2, the third resistive element T3, and the fourth resistive element T4 may have identical initial resistance values, and may all be photosensitive resistive elements having identical photosensitivity. Further, the first resistive elements T1, the second resistive element T2, the third resistive element T3, and the fourth resistive element T4 may have identical temperature sensitivity coefficients.

Further, the photosensitive detection module 01 may also include a light-shielding element M1 that blocks the second resistive element T2 and the third resistive element T3 from being irradiated by the ambient light. Meanwhile, the first resistive element T1 and the fourth resistive element T4 may be exposed and irradiated by the ambient light. As such, the effect of the temperature change may be eliminated, and a stable photosensitive detection module capable of detecting the ambient light may be obtained. In addition, because the first resistive elements T1, the second resistive element T2, the third resistive element T3, and the fourth resistive element T4 are identical resistive elements, the fabrication process may be simplified, the control of the uniform characteristics of the resistive elements such as temperature sensitivity coefficient may be facilitated. Accordingly, the precision of the light intensity detection and the stability of the photosensitive detection module may be further improved.

Figure 4:
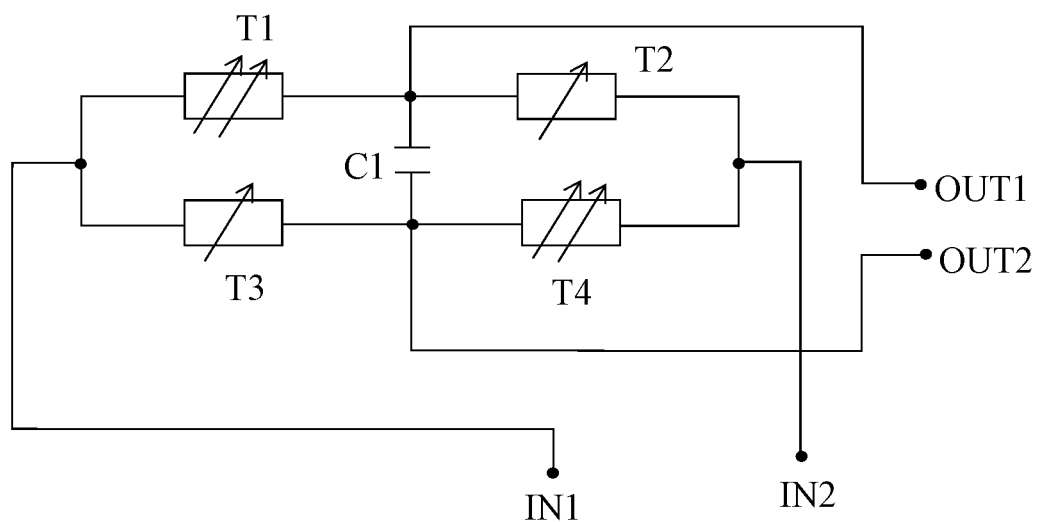
FIG. 4 illustrates a schematic diagram of another exemplary photosensitive circuit according to disclosed embodiments.

FIG. 4 illustrates a schematic diagram of another exemplary photosensitive circuit according to the disclosed embodiments. The similarities between FIG. 4 and FIG. 2 are not repeated, while certain difference may be explained. As shown in FIG. 4, different from the photosensitive circuit in FIG. 2, the photosensitive circuit may further include a first capacitor C1. The first capacitor C1 may include a top electrode and a bottom electrode. The top electrode may be connected to the node between the first resistive element T1 and the second resistive element T2. The bottom electrode may be connected to the node between the third resistive element T3 and the fourth resistive element T4.

The first capacitor C1 may play a role in voltage stabilizing and filtering in the photosensitive circuit. When the temperature of the resistive elements suddenly changes or light suddenly irradiates on the first resistive element T1 and the fourth resistive element T4, a spike of the output voltage may be generated. However, because of the charging process of the capacitor, the charge on the capacitor may not surge instantly, and the voltage across both electrodes of the first capacitor C1 may not change instantly. That is, the spike of the output voltage may be filtered out by the first capacitor C1, thereby stabilizing the circuit.

Figure 5:
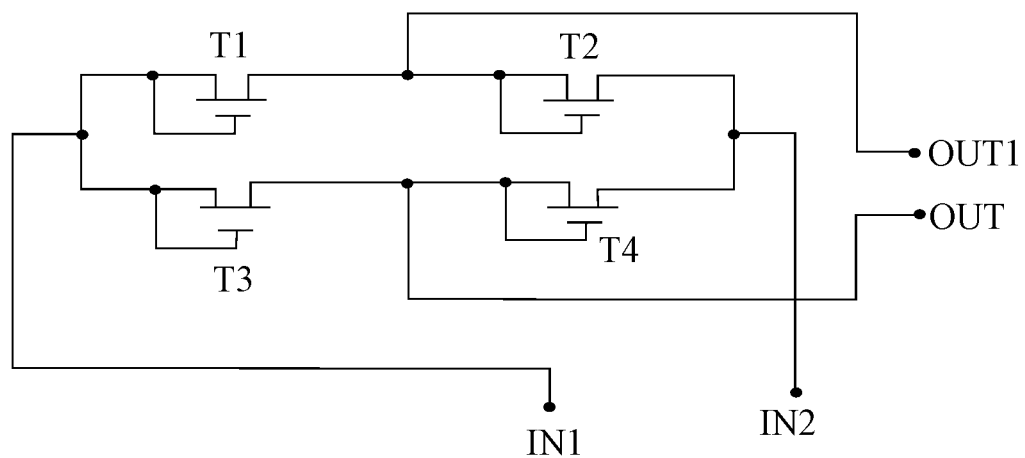
FIG. 5 illustrates a schematic diagram of another exemplary photosensitive circuit according to disclosed embodiments.
Figure 6:
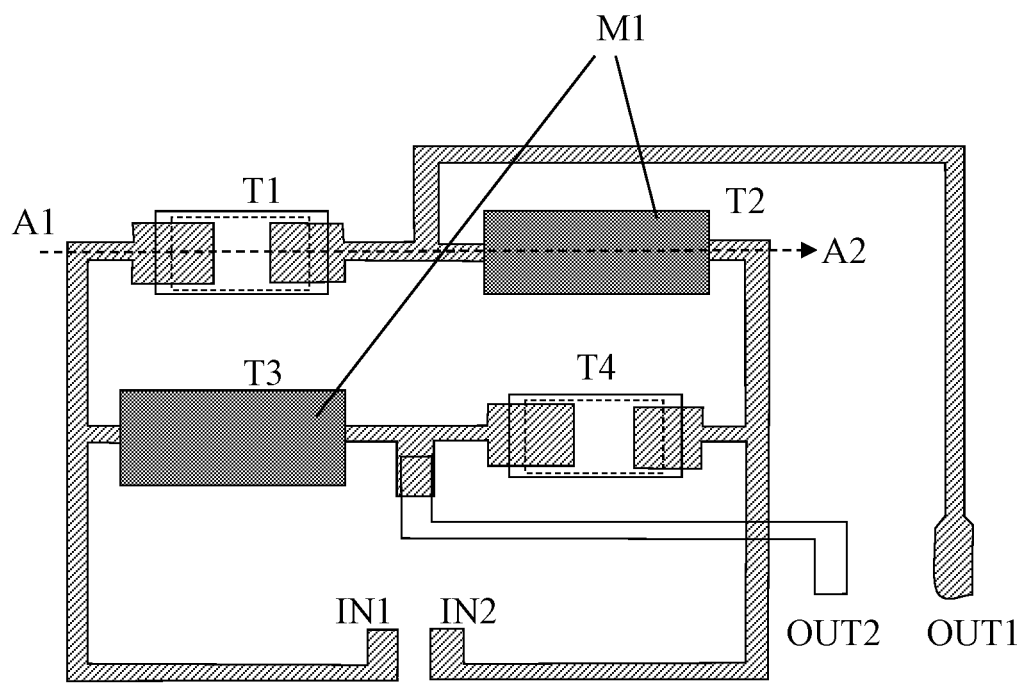
FIG. 6 illustrates a top view of an exemplary photosensitive circuit in FIG. 5.
Figure 7:
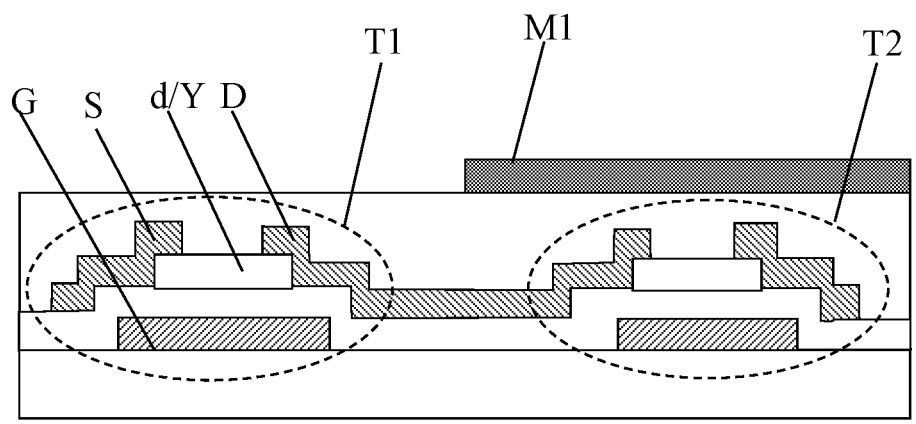
FIG. 7 illustrates an A1-A2 cross-sectional view of an exemplary photosensitive circuit in FIG. 6.

The present disclosure also provides photosensitive circuit as shown in FIGS. 5-7. FIG. 5 illustrates a schematic diagram of another exemplary photosensitive circuit according to the disclosed embodiments. FIG. 6 illustrates a top view of the exemplary photosensitive circuit shown in FIG. 5. FIG. 7 illustrates a cross-sectional view along A1-A2 in FIG. 6. As shown in FIGS. 5-7, the first resistive element T1, the second resistive element T2, the third resistive element T3, and the fourth resistive element T4 may be thin-film-transistors (TFT).

In particular, each thin-film-transistor may include a gate electrode G, a semiconductor active layer Y disposed above the gate electrode G and overlapping the gate electrode G, a gate electrode insulating layer configured to insulate between the gate electrode G and the semiconductor active layer Y, and a source electrode S and a drain electrode D that are connected to both ends of the semiconductor active layer Y, respectively. The gate electrode G, the source electrode S, and the drain electrode D may be formed of a metallic material. The semiconductor active layer Y may be formed of a polysilicon material.

In one embodiment, the semiconductor active layer Y may be formed of a low-temperature polysilicon material. A channel region d formed in the semiconductor active layer Y between the source electrode S and the drain electrode D may be equivalent to a resistor of the resistive element. The polysilicon material, especially the low-temperature polysilicon material may generate photo-induced carriers when being irradiated by light. The carriers may move through the channel region d between the source electrode S and the drain electrode D, such that a photo-induced leakage current may be formed between the source electrode S and the drain electrode D, and the channel region d between the source electrode S and the drain electrode D may become conductive.

In one embodiment, the first resistive element T1, the second resistive element T2, the third resistive element T3, and the fourth resistive element T4 may be identical thin-film-transistors, and the corresponding semiconductor active layers may be formed of a same material. In other words, the first resistive element T1, the second resistive element T2, the third resistive element T3, and the fourth resistive element T4 may have identical initial resistance values and identical temperature sensitivity coefficients, and may include photosensitive resistive material having identical photosensitivity. When being exposed to light irradiation, the first resistive element T1, the second resistive element T2, the third resistive element T3, and the fourth resistive element T4 may generates photo-induced carriers, leading to a resistance reduction.

In the fabrication process, the first resistive element T1, the second resistive element T2, the third resistive element T3, and the fourth resistive element T4 may be formed in a single step. The gate electrodes of all the resistive elements (i.e., T1-T4) may be formed in a same layer. The active layers of all the resistive elements (i.e., T1-T4) may be formed in another same layer. The source electrodes and the drain electrodes of all the resistive elements (i.e., T1-T4) may be formed in another same layer. Thus, the fabrication process may be simplified, and the production cost may be reduced.

In particular, the first resistive element T1, the second resistive element T2, the third resistive element T3, and the fourth resistive element T4 may be connected together to form a resistor bridge. The source electrode of the first resistive element T1 may be connected to the source electrode of the third resistive element T3. The drain electrode of the first resistive element T1 may be connected to the source electrode of the second resistive element T2. The source electrode of the second resistive element T2 may be connected to the drain electrode of the first resistive element T1. The drain electrode of the second resistive element T2 may be connected to the drain electrode of the fourth resistive element T4. The source electrode of the third resistive element T3 may be connected to source electrode of the first resistive element T1. The drain electrode of the third resistive element T3 may be connected to the source electrode of the fourth resistive element T4. The source electrode of the fourth resistive element T4 may be connected to the drain electrode of the third resistive element T3. The drain electrode of the fourth resistive element T4 may be connected to the drain electrode of the second resistive element T2.

Further, the photosensitive circuit may include a first input terminal IN1, a second input terminal IN2, a first output terminal OUT1, and a second output terminal OUT2. The first input terminal IN1 may be connected to a node between the source electrode of the first resistive element T1 and the source electrode of the third resistive element T3. The second input terminal IN2 may be connected to a node between the drain electrode of the second resistive element T2 and the drain electrode of the fourth resistive element T4. The first output terminal OUT1 may be connected to a node between the drain electrode of the first resistive element T1 and the source electrode of the second resistive element T2. The second output terminal OUT2 may be connected to a node between the drain electrode of the third resistive element T3 and the source electrode of the fourth resistive element T4.

In one embodiment, from T1 to T4, the gate electrode of each resistive element may be connected to the source electrode of the same resistive element. In other words, the gate electrode of each resistive element may be shorted with its own source electrode. In particular, the gate electrode of the first resistive element T1 may be connected to the source electrode of the first resistive element T1. The gate electrode of the second resistive element T2 may be connected to the source electrode of the second resistive element T2. The gate electrode of the third resistive element T3 may be connected to the source electrode of the third resistive element T3. The gate electrode of the fourth resistive element T4 may be connected to the source electrode of the fourth resistive element T4.

In one embodiment, the photosensitive detection module may include a light-shielding element M1. The light-shielding element M1 may cover the channel regions d of the second resistive element T2 and the third resistive element T3, such that the resistance values of the second resistive element T2 and the third resistive element T3 may not be affected by the ambient light irradiation, while the channel regions d of the first resistive element T1 and the fourth resistive element T4 may be exposed to the ambient light irradiation. The resistance values of the corresponding channel regions d of the first resistive element T1 and the fourth resistive element T4 may vary with the light irradiation intensity. The light-shielding element M1 may be, for example, formed of a light-shielding metallic material.

Because the first resistive element T1, the second resistive element T2, the third resistive element T3, and the fourth resistive element T4 are made of a same material, the relative changes of the resistance values due to the temperature changes may be identical. Without light irradiating on the photosensitive detection module, the output voltage of the photosensitive circuit may remain to be 0. That is, the output voltage of the photosensitive circuit may not be affected by the temperature changes of the resistive elements in the photosensitive circuit.

When the intensity of the light irradiated on the photosensitive circuit changes, because the channel regions of the second resistive element T2 and the third resistive element T3 are shielded by the light-shielding element M1, the resistance values of the corresponding channel regions may substantially remain the same, while the resistance values of the first resistive element T1 and the fourth resistive element T4 may increase or decrease with the change of the light irradiation intensity. The relative changes of the corresponding resistance values of the first resistive element T1 and the fourth resistive element T4 may be identical. In other words, when the intensity of the light irradiating on the photosensitive circuit changes, the output voltage may be no longer 0. Compared to the initial output voltage, the output voltage of the photosensitive circuit may have changed, which may be detected by a voltage detection circuit.

Thus, the output voltage of the photosensitive circuit may not be affected by the temperature change of the resistive elements, and may only correspond to the intensity of the light irradiated on the photosensitive circuit and, accordingly, the effect of the temperature change on the photosensitive detection module may be eliminated. The light intensity of the ambient light may be detected precisely based on the output voltage of the photosensitive circuit. A stable optoelectronic control circuit may be formed.

Figure 8:
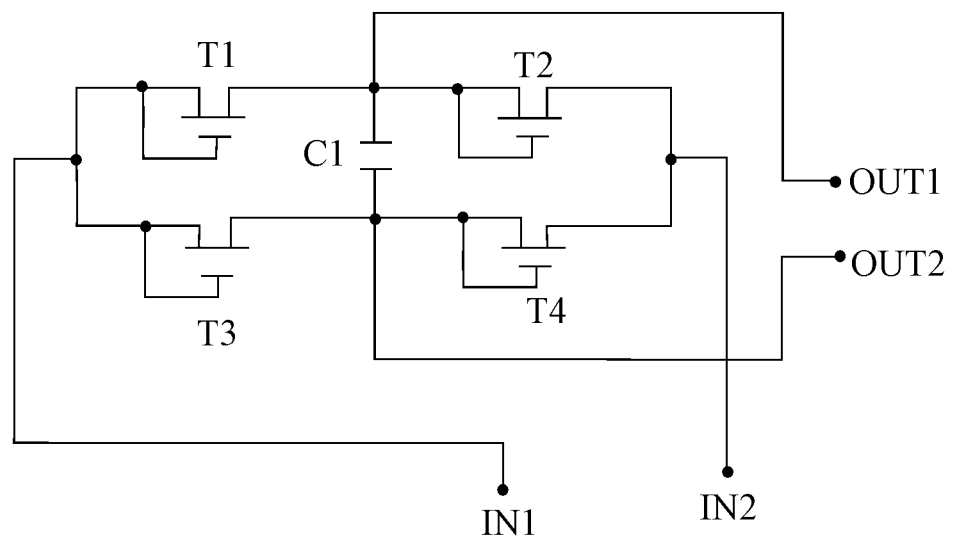
FIG. 8 illustrates a schematic diagram of another exemplary photosensitive circuit according to disclosed embodiments.
Figure 9:
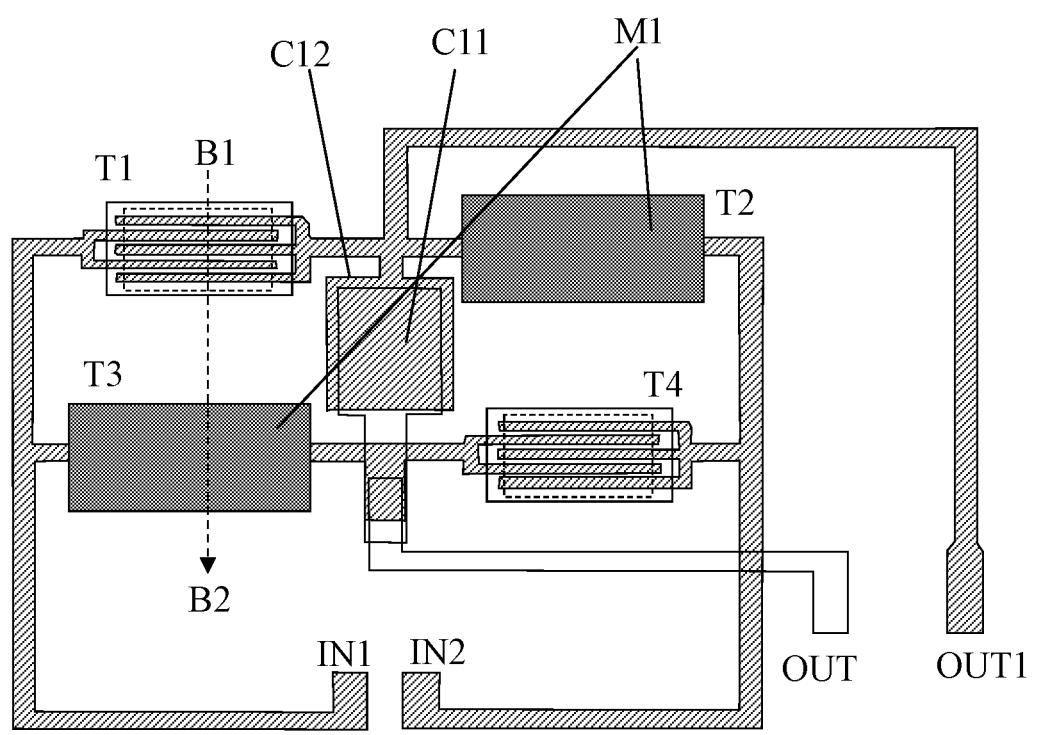
FIG. 9 illustrates a top view of an exemplary photosensitive circuit in FIG. 8.
Figure 10:
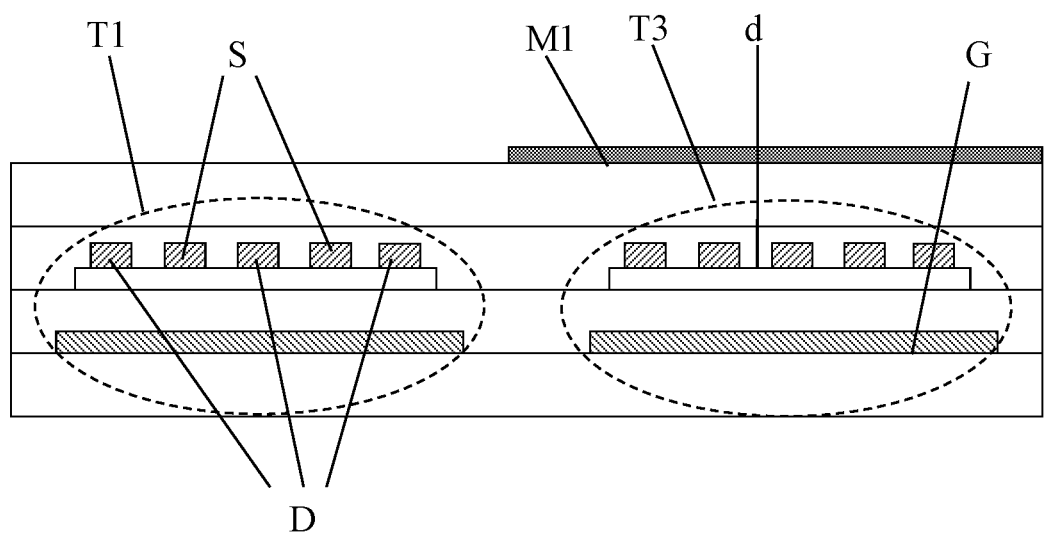
FIG. 10 illustrates a B1-B2 cross-sectional view of another exemplary photosensitive circuit in FIG. 9.

FIG. 8 illustrates a schematic diagram of another exemplary photosensitive circuit according to disclosed embodiments. FIG. 9 illustrates a top view of an exemplary photosensitive circuit in FIG. 8. FIG. 10 illustrates a B1-B2 cross-sectional view of another exemplary photosensitive circuit in FIG. 9. The similarities between FIGS. 8-10 and FIGS. 5-7 are not repeated, while certain difference may be explained.

As shown in FIGS. 8-10, the first resistive element T1, the second resistive element T2, the third resistive element T3, and the fourth resistive element T4 may be thin-film-transistors. The corresponding semiconductor active layers may be, for example, formed of a polysilicon material. In particular, the semiconductor active layers may be formed of a low-temperature polysilicon material. The difference is that the photosensitive circuit may now include a first capacitor C1 configured to stabilize the photosensitive circuit. The first capacitor C1 may include a top electrode C11 and a bottom electrode C12. The top electrode C11 may be connected to a node between the drain electrode of the first resistive element T1 and the source electrode of the second resistive element T2. The bottom electrode C12 may be connected to a node between the drain electrode of the third resistive element T3 and the source electrode of the fourth resistive element T4.

In the fabrication process, the first capacitor C1 may be formed at the same time as the thin-film-transistors. In one embodiment, the top electrode C11 of the first capacitor C1 may be formed coplanar with the gate electrodes of the thin-film-transistors, and the bottom electrode C12 of the first capacitor C1 may be formed coplanar with the source electrodes and the drain electrodes of the thin-film-transistors. In another embodiment, the bottom electrode C12 of the first capacitor C1 may be formed coplanar with the gate electrodes of the thin-film-transistors, and the top electrode C11 of the first capacitor C1 may be formed coplanar with the source electrodes and the drain electrodes of the thin-film-transistors. Thus, the fabrication process may be simplified, and the production cost may be reduced.

Further, in one embodiment, to maximize a ratio of channel width to channel length in a minimum space to obtain substantially large photo-induced leakage current and to improve the light intensity detection sensitivity of the photosensitive detection module, the resistive elements may be formed in the structures as shown in FIG. 9 and FIG. 10. As shown in FIGS. 9-10, the drain electrode D of each thin-film-transistor may include a plurality of first branches, and one end of each of the plurality of the first branches may be connected together. The source electrode S of each thin-film-transistor may include a plurality of second branches, and one end of each of the plurality of the second branches may be connected together. The plurality of the first branches and the plurality of the second branches may be interleaved with each other. That is, each second branch may be disposed between two adjacent first branches without contacting the first branches, thereby forming a sub-channel region between each first branch and the adjacent second branches. Provided that the overall area of the semiconductor active layer remains substantially the same, the ratio of the channel width to the channel length of the thin-film-transistor may be increased. Accordingly, the light intensity detection sensitivity of the photosensitive detection module may be increased.

Figure 11:
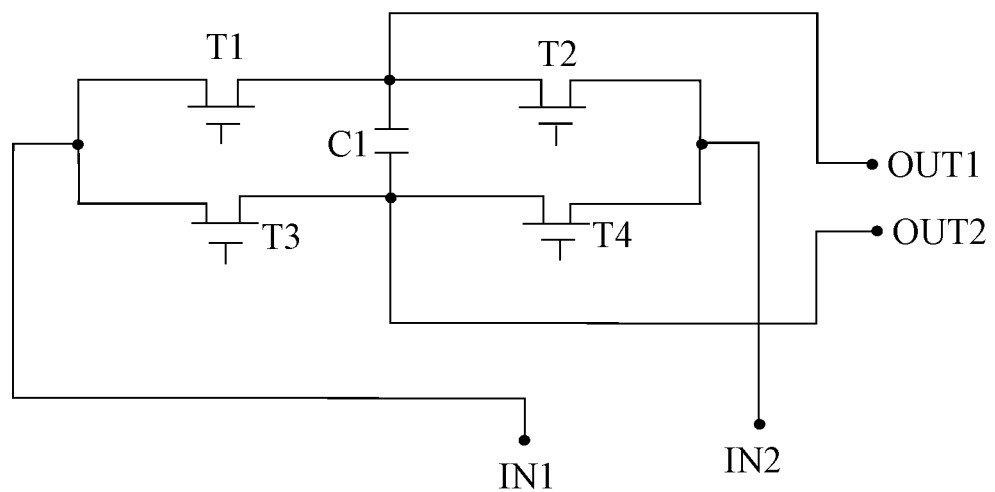
FIG. 11 illustrates a schematic diagram of another exemplary photosensitive circuit according to disclosed embodiments.

FIG. 11 illustrates a schematic diagram of another exemplary photosensitive circuit according to disclosed embodiments. The similarities between FIG. 11 and FIG. 8 are not repeated, while certain difference may be explained.

In one embodiment, as shown in FIG. 11, the first resistive element T1, the second resistive element T2, the third resistive element T3, and the fourth resistive element T4 may be thin-film-transistors. The corresponding semiconductor active layers may be, for example, formed of a polysilicon material. In particular, the semiconductor active layers may be formed of a low-temperature polysilicon material. The difference is that the gate electrodes of the thin-film-transistors may be floated without connecting to any other circuit structure.

In another embodiment, the semiconductor active layer, the source electrode, and the drain electrode of the thin-film-transistor may be formed directly without the gate electrode, which is for illustrative purposes and is not intended to limit the present disclosure.

Figure 12:
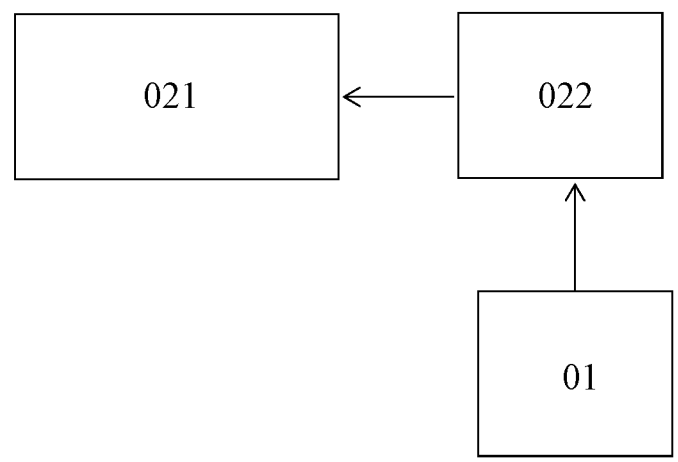
FIG. 12 illustrates a schematic diagram of an exemplary light source module according to disclosed embodiments.

The present disclosure also provides a light source module. FIG. 12 illustrates a schematic diagram of an exemplary light source module according to disclosed embodiments. As shown in FIG. 12, the light source module 02 may include a light source unit 021, a light source driving unit 022, and a photosensitive detection module 01. The photosensitive detection module 01 may be any one of the disclosed photosensitive detection modules.

The photosensitive detection module 01 may be used to detect the brightness of the current environment where the light source module 02 is located. In response to the brightness change of the environment, a corresponding output voltage may be generated by the photosensitive detection module 01. The output voltage may be sent to the light source driving unit 022 that is connected to the photosensitive detection module 01. The brightness of the current environment may refer to the ambient light intensity or the brightness of an external light source.

After receiving the output voltage sent by the photosensitive detection module 01, the light source driving unit 022 may generate a corresponding light source brightness adjustment parameter. That is, based on the output voltage provided by the photosensitive detection module 01, the light source driving unit 022 may calculate and obtain a driving voltage for driving the light source unit 021, and may send the driving voltage to the light source unit 021 that is connected to the light source driving unit 022, for the purpose of adjusting the brightness of the light emitted from the light source unit 021. Thus, based on the brightness of the current environment, the brightness of the light emitted from the light source unit 021 may be adjusted and, accordingly, the light source module 02 may satisfy the brightness requirement and, meanwhile, reduce the driving voltage to lower the power consumption.

The structure of the light source unit 021 may be determined according to various application scenarios, which is not limited by the present disclosure. In one embodiment, the light source unit 021 may include a LED light bar and a light guide plate. The LED light bar may include a circuit board and a plurality of LEDs disposed on the circuit board. The light-emitting surface of the plurality of the LEDs may face toward the light incident surface of the light guide plate.

Figure 13:
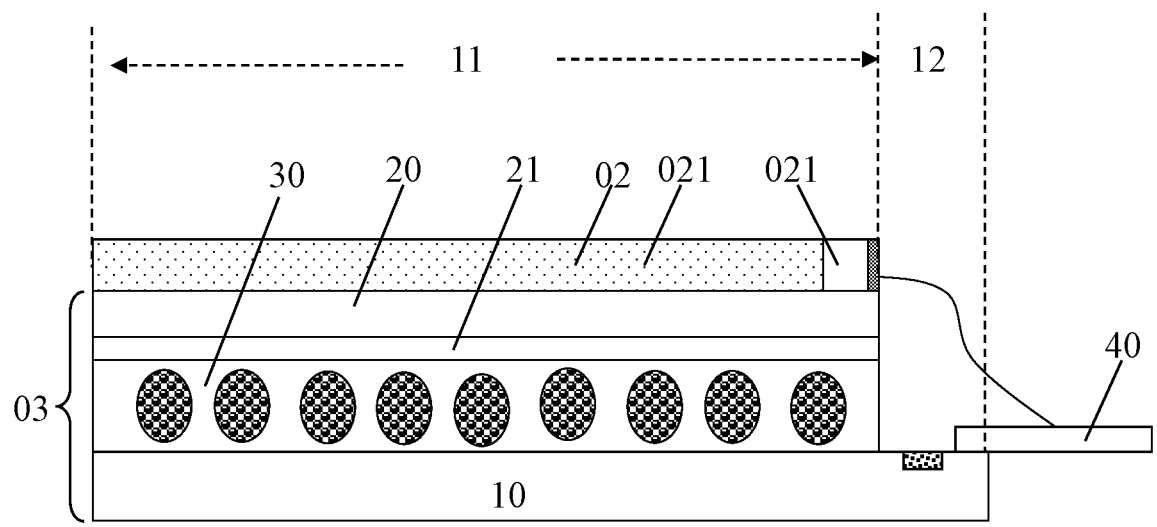
FIG. 13 illustrates a cross-sectional view of an exemplary electrophoresis display apparatus according to disclosed embodiments.
Figure 14:
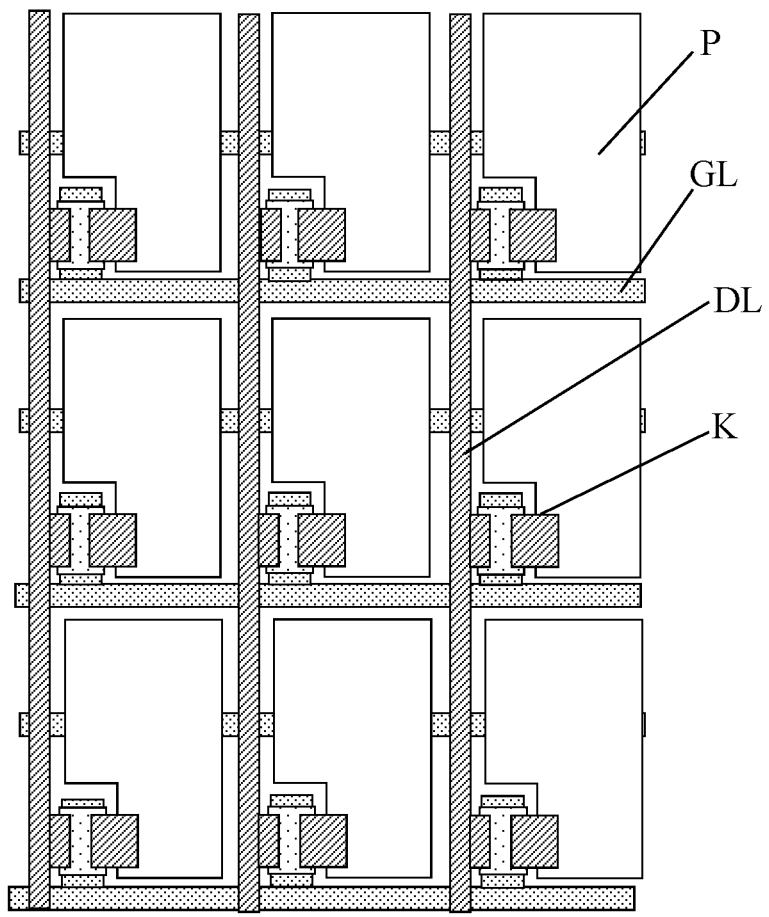
FIG. 14 illustrates a top view of an exemplary array substrate of an exemplary electrophoresis display apparatus in FIG. 13.
Figure 15:
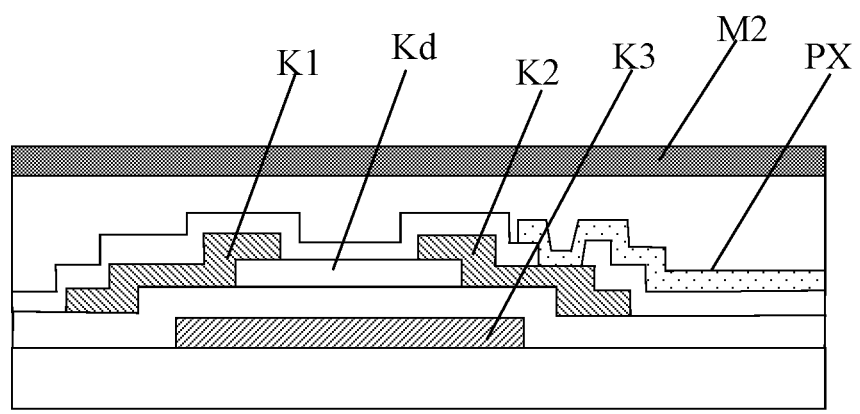
FIG. 15 illustrates a cross-sectional view of an exemplary array substrate of an exemplary electrophoresis display apparatus in FIG. 13.

The present disclosure further provides an electrophoresis display apparatus. FIG. 13 illustrates a cross-sectional view of an exemplary electrophoresis display apparatus according to disclosed embodiments. FIG. 14 illustrates a top view of an exemplary array substrate of an exemplary electrophoresis display apparatus in FIG. 13. FIG. 15 illustrates a cross-sectional view of an exemplary array substrate of an exemplary electrophoresis display apparatus in FIG. 13.

As shown in FIG. 13, the electrophoresis display apparatus may include an electrophoresis display panel 03 and a light source module 02. The light source module 02 may be disposed on the electrophoresis display panel 03 as a front light source of the electrophoresis display panel 03. When the electrophoresis display apparatus is used in a weak ambient light or in a dark environment, the light source module 02 may provide display lighting for the electrophoresis display panel 03 to improve display quality.

In one embodiment, as shown in FIG. 12, the light source module 02 may include a light source unit 021, a light source driving unit 022, and a photosensitive detection module 01. The photosensitive detection module 01 may be any one of the disclosed photosensitive detection modules.

The light source unit 021 may include a light-emitting element 0212. The light-emitting element 0212 may be, for example, a LED light bar or a fluorescent tube. In addition, to make the light emitted from the light-emitting element 0212 more uniform, the light source module 02 may include a light guide plate 0211. The light-emitting element 0212 may be disposed on the light incident surface of the light guide plate 0211. A portion of light emitted from the light-emitting element 0212 may pass through the light guide plate 0211 to enter the electrophoresis display panel 03, and then may be reflected back by, e.g., electrophoretic particles inside the electrophoresis display panel 03, to display pre-determined images.

In one embodiment, as shown in FIG. 13, the electrophoresis display panel 03 may include an array substrate 10, an electrophoresis film layer 30, a common electrode layer 21, and a protective layer 20. The electrophoresis film layer 30 may be disposed between the array substrate 10 and the protective layer 20. The common electrode layer 21 may be disposed between the electrophoresis film layer 30 and the protective layer 20.

The array substrate 10 may include a display region 11 and a non-display region 12 surrounding the display region 11. The electrophoresis film layer 30 may be configured in the display region 11.

FIG. 14 and FIG. 15 illustrate the specific structures of the array substrate 10. As shown in FIGS. 14-15, the array substrate 10 may include a substrate and a pixel array disposed on the substrate. A pixel electrode PX may be formed in a pixel region P of the pixel array. The pixel array may include a plurality of data lines DL and a plurality of scanning lines GL. The plurality of the data lines DL may intersect with the plurality of the scanning lines GL to form a plurality of pixel regions P. The scanning lines GL may supply scanning signals to the pixel electrodes PX. The data lines DL may supply data signals to the pixel electrodes PX. Under the electric field formed between a common voltage applied to the common electrode layer 21 and a pixel voltage applied to the pixel electrode (i.e., the data signal), the electrophoretic particles in the electrophoresis film layer 30 may move toward the common electrode layer 21 or toward the pixel electrodes PX.

For example, the electrophoretic particles may include white electrophoretic particles and black electrophoretic particles. When a data signal having a certain polarity (e.g., positive polarity) is supplied to a pixel electrode PX through a data line, the white electrophoretic particles may move toward the common electrode layer 21 and the black electrophoretic particles may move toward the pixel electrode PX. When a data signal having a different polarity (e.g., negative polarity) is supplied to the pixel electrode PX through the data line, the black electrophoretic particles may move toward the common electrode layer 21 and the white electrophoretic particles may move toward the pixel electrode PX. In addition, the amplitude of the data signal may determine the magnitude of the movement of the electrophoretic particles. Thus, through controlling the polarity and the amplitude of the data signal, and reflecting the light irradiated on the electrophoretic particles, the pre-determined images may be displayed.

In one embodiment, the light source unit 021 of the light source module 02 may be configured on the electrophoresis display panel 03. A portion of the photosensitive detection module 01 of the light source module 02 may be configured on the array substrate 10. For example, the photosensitive circuit 011 may be configured in the non-display region 12 of the array substrate 10.

Further, the array substrate 10 may include a plurality of display driving switches K arranged in an array and disposed in the display region 11 of the array substrate 10. Each pixel region P may include at least one display driving switch K. Each display driving switch K may be, for example, disposed at the intersection of a data line DL and a scanning line GL. In one embodiment, the first resistive element T1, the second resistive element T2, the third resistive element T3, and the fourth resistive element T4 forming the photosensitive circuit 011 may be thin-film-transistors same as the display driving switch K. The thin-film-transistor may include a channel region formed in a semiconductor active layer. The semiconductor active layer may be, for example, formed of an amorphous silicon material, and in particular, may be formed of a low-temperature amorphous silicon material.

In one embodiment, in the fabrication process of the array substrate 10, the gate electrodes of the first resistive element T1, the second resistive element T2, the third resistive element T3, and the fourth resistive element T4 of the photosensitive circuit 011 may be formed coplanar with the gate electrode K3 of the display driving switch K. The source electrodes of the first resistive element T1, the second resistive element T2, the third resistive element T3, and the fourth resistive element T4 of the photosensitive circuit 011 may be formed coplanar with the source electrode K1 of the display driving switch K. The drain electrodes of the first resistive element t1, the second resistive element T2, the third resistive element T3, and the fourth resistive element T4 of the photosensitive circuit 011 may be formed coplanar with the drain electrode K2 of the display driving switch K. The semiconductor active layers of the first resistive element T1, the second resistive element T2, the third resistive element T3, and the fourth resistive element T4 of the photosensitive circuit 011 may be formed coplanar with the semiconductor active layer Kd of the display driving switch K. Thus, the photosensitive circuit 011 of the light source module 02 may be formed on the array substrate 10 without introducing additional steps in the fabrication process of the array substrate 10.

Further, the drain electrodes of the first resistive element T1, the second resistive element T2, the third resistive element T3, the fourth resistive element T4, and the display driving switch K may be formed coplanar with the source electrodes of the first resistive element T1, the second resistive element T2, the third resistive element T3, the fourth resistive element T4, and the display driving switch K. The source electrodes and the drain electrodes of the first resistive element T1, the second resistive element T2, the third resistive element T3, the fourth resistive element T4, and the display driving switch K may be formed coplanar with the data lines DL of the array substrate 10. Thus, the fabrication process may be simplified, and the production cost may be reduced.

In one embodiment, the array substrate 10 may further include a light-shielding layer M2, e.g., a metal light-shielding layer, which is configured to shield the channel region of the display driving switch K, thereby preventing the ambient light from irradiating on the channel region of the display driving switch K. Thus, the photo-induced leakage current may be eliminated in the display driving switch K, and the displayed images may not be affected. Further, the light-shielding elements M1 covering the second resistive element T2 and the third resistive element T3 in the light source module 02 may be formed coplanar with the light-shielding layer M2. Thus, the fabrication process may be further simplified, and the production cost may be reduced.

In one embodiment, the electrophoresis display apparatus may further include a main flexible circuit board 40. The non-display region 12 of the array substrate 10 may include a bonding region. The main flexible circuit board 40 may be bonded to the bonding region of the array substrate 10. The main flexible circuit board 40 may include a printed circuit configured for transferring display driving signals to the array substrate 10. For example, the integrated circuit chip of the electrophoresis display panel 03 may be disposed on the array substrate 10, and may be connected to an external printed circuit board through the printed circuit of the main flexible circuit board 40. In another embodiment, the integrated circuit chip may be directly disposed on the main flexible circuit board 40, and may be connected simultaneously to the wires on the array substrate 10 for transferring display driving signals and the external printed circuit board, through the printed circuit of the main flexible circuit board 40.

In one embodiment, the light source driving unit 022 of the light source module 02, and the bias voltage supplying circuit 012 and the voltage detection circuit 013 of the photosensitive detection module 01 may be disposed on the main flexible circuit board 40. The photosensitive circuit 011 of the photosensitive detection module 01 may be disposed in the non-display region 12 of the array substrate 10. The bias voltage supplying circuit 012 and the voltage detection circuit 013 may be connected to the photosensitive circuit 011 through the printed circuit of the main flexible circuit board 40. Through the printed circuit of the main flexible circuit board 40, the bias voltage supplying circuit 012 may be connected to the first input terminal IN1 and the second input terminal IN2 of the photosensitive circuit 011 to supply a bias voltage to the photosensitive circuit 011. Through the printed circuit of the main flexible circuit board 40, the voltage detection circuit 013 may be connected to the first output terminal OUT1 and the second output terminal OUT2 of the photosensitive circuit 011 to detect the output voltage of the photosensitive circuit 011.

When the electrophoresis display apparatus is in an operating state, the photosensitive detection module 01 may generate an output voltage in response to the brightness change of the ambient environment, and may send the output voltage to the light source driving unit 022 that is connected to the photosensitive detection module 01. After receiving the output voltage sent by the photosensitive detection module 01, the light source driving unit 022 may generate a corresponding light source brightness adjustment parameter.

That is, based on the output voltage provided by the photosensitive detection module 01, the light source driving unit 022 may calculate and obtain a driving voltage for driving the light source unit 021, and may send the driving voltage to the light source unit 021 that is connected to the light source driving unit 022, for the purpose of adjusting the brightness of the light emitted from the light source unit 021. Thus, based on the brightness of the current environment, the brightness of the light emitted from the light source unit 021 may be adjusted, such that the light source module 02 may satisfy the brightness requirement, and at the same time, reduce the driving voltage to lower the power consumption.

When the external ambient light is weak, dim, or completely dark, the external ambient light may be insufficient for the electrophoresis displaying. Then, the brightness of the light source module 02 may be increased. The light emitted from the light source module 02 may assist the image display. When the external ambient light is sufficiently bright, the external ambient light may be sufficient for the electrophoresis displaying. Then, the brightness of the light source module 02 may be decreased or the light-emitting component of the light source module 02 may be completely turned off to lower the power consumption. The brightness of the external ambient light may be detected by the photosensitive detection module 01 of the light source module 02. The output voltage of the photosensitive detection module 01 may not be affected by the operating temperature change of the resistive elements and, thus, may sense the brightness of the external ambient light precisely.

Moreover, the photosensitive circuit 011 and the light-shielding elements M1 of the photosensitive detection module 01 may be formed together with the display components on the array substrate 10. Thus, no additional steps may be introduced in the fabrication process of the array substrate 10.

In the disclosed embodiments, the photosensitive detection module may include the photosensitive circuit. The photosensitive circuit may include the first resistive element T1, the second resistive element T2, the third resistive element T3, and the fourth resistive element T4. The first input terminal IN1 may be connected to the node between the first resistive element T1 and the third resistive element T3. The second input terminal IN2 may be connected to the node between the second resistive element T2 and the fourth resistive element T4. The first output terminal OUT1 may be connected to the node between the first resistive element T1 and the second resistive element T2. The second output terminal OUT2 may be connected to the node between the third resistive element T3 and the fourth resistive element T4. The first resistive element T1, the second resistive element T2, the third resistive element T3, and the fourth resistive element T4 may have an identical initial resistance values. The first resistive element T1 and the fourth resistive element T4 may be photosensitive resistive elements. The material forming the first resistive element T1 and the material forming the fourth resistive element T4 may have an identical photosensitivity.

Further, the material forming the second resistive element T2 and the material forming the fourth resistive element T4 may have an identical temperature sensitivity coefficient. The material forming the first resistive element T1 and the material forming the third resistive element T3 may have an identical temperature sensitivity coefficient.

The output voltage of the photosensitive circuit may not be affected by the temperature change of the resistive elements, and may only correspond to the intensity change of the light irradiated on the photosensitive circuit. Thus, the effect of temperature change on the photosensitive detection module may be eliminated, the intensity of the ambient light may be precisely detected based on the output voltage of the photosensitive circuit, and a stable optoelectronic control circuit may be realized.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A photosensitive detection module, comprising a photosensitive circuit, wherein the photosensitive circuit comprises:

a first resistive element, a second resistive element, a third resistive element, and a fourth resistive element to form a resistor bridge, a first input terminal connected to a node between the first resistive element and the third resistive element;

a second input terminal connected to a node between the second resistive element and the fourth resistive element;

a first output terminal connected to a node between the first resistive element and the second resistive element; and a second output terminal connected to a node between the third resistive element and the fourth resistive element, wherein:

the first resistive element, the second resistive element, the third resistive element, and the fourth resistive element have an identical initial resistance value;

the first resistive element and the fourth resistive element are photosensitive resistive elements, and a material forming the first resistive element and a material forming the fourth resistive element have an identical photosensitivity; and a material forming the second resistive element and the material forming the fourth resistive element have an identical temperature sensitivity coefficient, and the material forming the first resistive element and a material forming the third resistive element have an identical temperature sensitivity coefficient.

2. The photosensitive detection module according to claim 1, further including:

a bias voltage supplying circuit connected to the first input terminal and the second input terminal and, configured to supply a bias voltage to the photosensitive circuit; and a voltage detection circuit connected to the first output terminal and the second output terminal, and configured to detect an output voltage of the photosensitive circuit.

3. The photosensitive detection module according to claim 1, wherein:

the first resistive element, the second resistive element, the third resistive element, and the fourth resistive element are identical resistive elements; and the photosensitive detection module further includes a light-shielding element configured to shield the second resistive element and the third resistive element from being exposed to light irradiation.

4. The photosensitive detection module according to claim 1, wherein:

the photosensitive circuit further includes a first capacitor;

a top electrode of the first capacitor is connected to a node between the first resistive element and the second resistive element; and a bottom electrode of the first capacitor is connected to a node between the third resistive element and the fourth resistive element.

5. The photosensitive detection module according to claim 4, wherein:

the first resistive element, the second resistive element, the third resistive element, and the fourth resistive element each includes a thin-film-transistor;

the thin-film-transistor includes a channel region formed in a semiconductor active layer;

one of the top electrode of the first capacitor and the bottom electrode of the first capacitor is formed coplanar with a gate electrode of the thin-film-transistor; and the other of the top electrode of the first capacitor and the bottom electrode of the first capacitor is formed coplanar with a source electrode of the thin-film-transistor.

6. The photosensitive detection module according to claim 1, wherein:

the first resistive element, the second resistive element, the third resistive element, and the fourth resistive element each includes a thin-film-transistor;

the thin-film-transistor includes a channel region formed in a semiconductor active layer;

a source electrode of the first resistive element and a source electrode of the third resistive element are connected to the first input terminal;

a drain electrode of the second resistive element and a drain electrode of the fourth resistive element are connected to the second input terminal;

a drain electrode of the first resistive element and a source electrode of the second resistive element are connected to the first output terminal;

a drain electrode of the third resistive element and a source electrode of the fourth resistive element are connected to the second output terminal;

the photosensitive detection module further includes a light-shielding element;

the light-shielding element shields the channel regions of the second resistive element and the third resistive element from being exposed to light irradiation;

the channel regions of the first resistive element and the fourth resistive element are exposed to ambient environment light; and the drain electrode of the first resistive element, the drain electrode of the second resistive element, the drain electrode of the third resistive element, the drain electrode of the fourth resistive element each includes a plurality of first branches, and the source electrode of the first resistive element, the source electrode of the second resistive element, the source electrode of the third resistive element, and the source electrode of the fourth resistive element each includes a plurality of second branches.

7. The photosensitive detection module according to claim 6, wherein:

a gate electrode of the first resistive element is connected to the source electrode of the first resistive element;

a gate electrode of the second resistive element is connected to the source electrode of the second resistive element;

a gate electrode of the third resistive element is connected to the source electrode of the third resistive element; and a gate electrode of the fourth resistive element is connected to the source electrode of the fourth resistive element.

8. The photosensitive detection module according to claim 6, wherein:

a gate electrode of the first resistive element, a gate electrode of the second resistive element, a gate electrode of the third resistive element, and a gate electrode of the fourth resistive element are floated.

* * * * *